United States Patent [19]

Chambers

[11] 4,291,115
[45] Sep. 22, 1981

[54] ELEMENTS AND METHOD WHICH USE PHOTOPOLYMERIZABLE COMPOSITIONS BASED ON SALT-FORMING POLYMERS AND POLYHYDROXY POLYETHERS

[75] Inventor: William J. Chambers, Wilmington, Del.

[73] Assignee: E. I. Du Pont de Nemours and Company, Wilmington, Del.

[21] Appl. No.: 188,223

[22] Filed: Sep. 17, 1980

Related U.S. Application Data

[60] Division of Ser. No. 76,621, Sep. 18, 1979, Pat. No. 4,245,031, which is a continuation-in-part of Ser. No. 892,296, Mar. 31, 1978, abandoned.

[51] Int. Cl.³ .......................... G03C 1/68; G03C 5/90
[52] U.S. Cl. .................................. 430/271; 430/275; 430/277; 430/281; 430/285; 430/288; 430/300; 430/302; 430/306
[58] Field of Search ............... 430/271, 275, 277, 281, 430/285, 288, 905, 991, 300, 302, 306, 322

[56] References Cited

U.S. PATENT DOCUMENTS

| | | | |
|---|---|---|---|
| 2,760,863 | 8/1956 | Plambeck, Jr. | 430/281 |
| 2,893,868 | 7/1959 | Barney | 430/281 |
| 3,549,367 | 12/1970 | Chang et al. | 430/281 |
| 3,661,576 | 5/1972 | Crary | 430/284 |

FOREIGN PATENT DOCUMENTS 2541133  3/1976  Fed. Rep. of Germany .
52-7362  3/1977  Japan .

*Primary Examiner*—Jack P. Brammer

[57] ABSTRACT

Photopolymerizable compositions containing
(1) a polymer having a plurality of salt-forming groups,
(2) an ethylenically unsaturated compound having at least one complementary salt-forming group,
(3) an ethylenically unsaturated diester polyhydroxy polyether of the formula

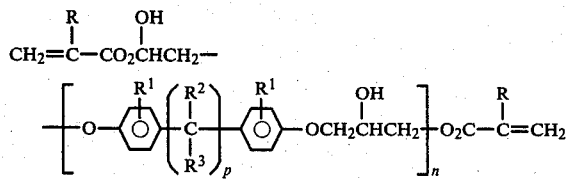

where R is H or $CH_3$; $R^1$ is H or an alkyl group of 1-4 carbon atoms; n is 1-15; p is 0 or 1; and when p is 1, $R^2$ is H or $CH_3$, and $R^3$ is H, $CH_3$ or $C_2H_5$; and
(4) a radiation-sensitive, free-radical generating system provide photopolymerizable elements which have outstanding photospeeds and are relatively insensitive to oxygen.

13 Claims, No Drawings

ELEMENTS AND METHOD WHICH USE PHOTOPOLYMERIZABLE COMPOSITIONS BASED ON SALT-FORMING POLYMERS AND POLYHYDROXY POLYETHERS

CROSS-REFERENCE TO RELATED APPLICATION

This is a division of copending application Ser. No. 076,621, now U.S. Pat. No. 4,245,031, which in turn is a continuation-in-part of copending application Ser. No. 892,296 filed Mar. 31, 1978, now abandoned.

DESCRIPTION

Technical Field

This invention relates to photopolymerizable compositions, and to photopolymerizable elements prepared therefrom. More particularly, this invention relates to such compositions and elements which are particularly useful in lithographic printing applications, in letterpress plates, and as photoresists.

Background Art

Photopolymerizable compositions containing a polymer having a plurality of salt-forming groups and an ethylenically unsaturated compound having a complementary salt-forming group are known. In U.S. Pat. No. 2,893,868, Barney discloses compositions and photopolymerizable elements comprising an addition polymer containing extralinear salt-forming groups, an ethylenically unsaturated addition-polymerizable monomer having at least one complementary salt-forming group, and an addition polymerization initiator. The disclosure does not mention photospeed or oxygen insensitivity.

Photopolymerizable compositions containing ethylenically unsaturated diester polyhydroxy polyethers are also known. In U.S. Pat. No. 3,661,576, Crary discloses and claims photopolymerizable compositions which contain an ethylenically unsaturated diester polyhydroxy polyether and an addition-polymerization initiator. The use of these compositions in the manufacture of photoresist films and printing plates is disclosed.

German Pat. No. 2,541,133 discloses photohardenable compositions which contain an ethylenically unsaturated compound of the type of an addition product obtained from one mole of an epoxy resin (for example a polycondensate of bisphenol-A and epichlorohydrin) and two moles of acrylic acid, methacrylic, or crotonic acid; a polymerization initiator; and an N-nitrosodiarylamine.

Japanese patent application No. 7362/77, published Mar. 2, 1977, describes photopolymerizable compositions which contain ethylenically unsaturated diester polyhydroxy polyethers, useful for printing plates, which also contain alkali-soluble copolymer resin capable of being addition-polymerized with the diester through a photochemical reaction.

In U.S. Pat. No. 3,549,367, Chang et al. describe improved photoinitiator systems composed of a 2,4,5-triarylimidazolyl dimer and a p-aminophenyl ketone, specifically Michler's ketone. Such compositions can be used in lithographic plates which have enhanced photographic speed and contrast.

DISCLOSURE OF INVENTION

The present invention provides a photopolymerizable composition which comprises about 30 to 100% by weight, in combination, of (1) polymer having a number average molecular weight of at least about 500, at least two salt-forming groups per polymer molecule, and at least about 0.025 equivalent of salt-forming group per 1000 grams of polymer;

(2) addition-polymerizable nongaseous, ethylenically unsaturated compound having at least one complementary salt-forming group and being capable of forming a polymer by free-radical initiated, chain-propagating addition polymerization; the ratio of equivalents of complementary salt-forming groups in compound (2) to equivalents of salt-forming groups in polymer (1) being about 1:2 to about 50:1;

(3) ethylenically unsaturated diester polyhydroxy polyether of the formula

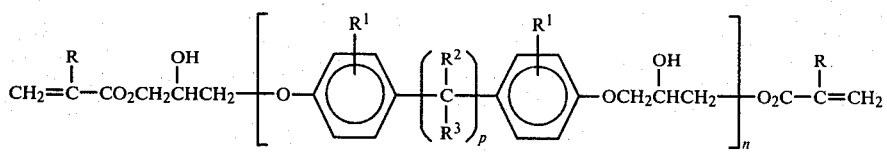

wherein R is H or CH$_3$; R$^1$ is H or an alkyl group of 1-4 carbon atoms, preferably H; n is 1-15, preferably 1-4; p is 0 or 1, preferably 1; and when p is 1, R$^2$ is H or CH$_3$, preferably CH$_3$, and R$^3$ is H, CH$_3$ or C$_2$H$_5$, preferably CH$_3$; the amount of polyether (3) being about 10 to about 75% by weight of the combined total of components (1), (2) and (3); and (4) about 1 to about 20% by weight, based on the total photopolymerizable composition, of a free-radical generating system, activatable by actinic radiation, which initiates polymerization of the unsaturated compounds.

Throughout the specification and claims the term "salt-forming group" is intended to mean a group which is capable of forming an ionic compound, as in the case of the reaction of a carboxylic acid with an amine to form a salt containing a carboxylate ion and an ammonium ion in accordance with the equation:

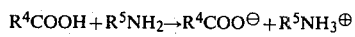

Although the compositions of this invention are defined throughout the specification and claims in terms of the components from which they are derived, it is understood that these compositions also contain the salts formed by interaction of the salt-forming and complementary salt-forming groups. The degree to which these salts form will vary depending upon the relative amounts and the relative strengths of the salt-forming groups present as discussed hereinafter.

The preferred compositions are those in which polymer (1) has a molecular weight of at least about 600 and contains at least about 0.1 and most preferably about 1.0 equivalent of salt-forming group selected from the group consisting of carboxylic acid groups and amine groups per 1000 grams of polymer, unsaturated compound (2) has a complementary salt-forming group selected from the group consisting of carboxylic acid groups and amine groups and is present in an amount sufficient to provide about 1 to about 15 equivalents of complementary salt-forming group for each equivalent of salt-forming group in polymer (1), polyether (3) is about 15 to about 75% by weight of the combined total of components (1), (2) and (3), and free-radical generating system (4) is a 2,4,5-triarylimidazolyl dimer and a free-radical producing electron donor and is present in the amount of about 5 to about 18% by weight, based on the total photopolymerizable composition.

This invention also provides photopolymerizable elements which comprise a substrate coated with a layer of the above composition having a thickness in the range from a coating weight of about 1 mg/dm$^2$ to about 5 mils or more in thickness. The preferred photopolymerizable elements are lithographic plates, lithographic films, letterpress plates, and photoresists.

Photopolymerization of the ethylenically unsaturated components of the photopolymerizable compositions of the present invention results in a crosslinked ionic network containing polyhydroxy polyether segments in the radiation-struck areas. These compositions are particularly useful for the preparation of photopolymerizable elements such as lithographic printing plates, lithographic films and letterpress plates. These photopolymerizable elements show extremely high photospeeds as compared with the photopolymerizable elements of the closest prior art. The photopolymerizable elements of this invention are also relatively insensitive to oxygen, that is, they can be imaged without the need for a topcoat or a cover sheet, as is usually required in the prior art.

The photopolymerizable compositions of this invention comprise at least about 30% by weight, in combination, of salt-forming polymer (1), complementary salt-forming compound (2), polyether (3) and free-radical generating system (4). Preferably, the photoactive system components of the photopolymerizable composition consist essentially of polymer (1), compound (2), polyether (3) and free-radical generating system (4).

The first essential component of the photopolymerizable compositions of this invention is at least one polymer having a number average molecular weight of at least about 500 and at least two salt-forming groups per polymer molecule. The polymer is preferably saturated, but can be ethylenically unsaturated, and preferably has a number average molecular weight of at least about 600.

The composition of the salt-forming polymer may vary widely, provided that it contains a plurality of salt-forming groups either within the main chain or as lateral susbstituents on the main chain. Salt-forming groups should be present in the amount of at least about 0.025 equivalent of salt-forming group per 1000 grams of polymer, preferably at least about 0.1 and most preferably at least about 1.0 equivalent of salt-forming group per 1000 grams of polymer. The content of salt-forming groups can be as high as desired, e.g., each combined monomer unit may contain a plurality of salt-forming groups. Other functionally-substituted combined monomer units can also be present in the polymer, including those containing ethylenically unsaturated, addition-polymerizable groups as lateral substituents. Similarly, nonfunctionally-substituted combined monomer units can also be present. Mixtures of two or more different polymers containing salt-forming radicals or groups can also be used.

Because of their availability and relatively low cost, the preferred polymeric components are those wherein the salt-forming substituents are acidic, i.e., carboxylic, phosphonic, sulfonic, sulfate and phosphate groups, or are basic, i.e., primary, secondary and tertiary amine groups. These salt-forming substituents may be lateral and can be bonded to the chain of the polymer, either directly and/or mediately, e.g., through ether, ester or amide linkages.

Suitable acidic polymeric components include those containing a plurality of combined recurring monomer units wherein addition-polymerizable ethylenic unsaturation is not terminal, e.g., polymers of crotonic and sorbic acids, and those wherein the polymerizable ethylenic linkage is terminal, i.e., the polymers of the vinylidene monomers carrying acidic functions, e.g., addition polymers of vinyl-phosphonic, -sulfonic and -benzoic acids; p-vinylbenzenesulfonic acid; the acrylic acids, including the α-substituted acrylic acids, e.g., acrylic, methacrylic, ethacrylic and chloroacrylic acids; vinyl phosphate; and vinyl sulfate. The useful acidic polymers also include polymers of monomers carrying a plurality of acidic functions, e.g., the polymers of itaconic, citraconic and maleic acids.

It is not necessary that the acidic polymers be polymers prepared from polymerizable acidic monomers. The necessary acidic functions can also be introduced into a preferred polymer chain by suitable well-known procedures, for instance, the sulfonation of preformed styrene polymers. Particularly preferred acidic polymers are those which contain carboxylic acid groups.

Suitable basic polymers having amine groups as lateral substituents on the main polymer chain may be polymers of basic amino-substituted olefins, e.g., unsaturated basic amines including allylamine and diallylamine and basic amino-substituted styrenes including p-(β-diethylaminoethyl)styrene and p-(β-dimethylaminoethyl)styrene and polymers of basic nitrogen-containing heterocyclic compounds, e.g., vinylpyridines and alkyl-substituted vinylpyridines including 3-vinylpyridine, 2-methyl-5-vinylpyridine and 2-vinyl-5-ethylpyridine. Additional useful addition polymers are those derived from esters of basic amino alcohols and unsaturated carboxylic acids including the alkyl- and cycloalkyl-substituted aminoalkyl and cycloalkyl esters of acrylic and alkacrylic acids, e.g., β-methylaminoethyl acrylate, 4-diethylaminocyclohexyl methacrylate and ββ-dioctylaminoethyl acrylate; unsaturated ethers of basic amino alcohols, e.g., β-aminoethyl vinyl ether and β-diethylaminoethyl vinyl ether; and amides of unsaturated carboxylic acids wherein a basic amino substituent is carried on the amide nitrogen, e.g., N-(β-dimethylaminoethyl)acrylamide.

A large number of suitable polymers and copolymers of aminoalcohol esters of the α-hydrocarbon substituted acrylic acids which can be employed are disclosed by Graves in U.S. Pat. No. 2,138,763 and by Harmon in U.S. Pat. No. 2,138,762, and these disclosures are hereby incorporated by reference.

Procedures for the preparation of suitable polymers containing lateral basic amino substituents are described by Barney in Column 11 of U.S. Pat. No. 2,893,868, and this disclosure is hereby incorporated by reference.

Addition polymers containing a wholly-carbon chain and a plurality of lateral salt-forming groups are frequently employed. However, condensation polymers which contain a plurality of salt-forming groups are also suitable, e.g., polyamides, polyesters, polyamines, polyurethanes, etc. When basic polymers containing amine groups are employed, such polymers may contain amine groups as an integral part of the main polymer chain, e.g., the alkylenimine polymers such as polyethylene imine. Preferred, because of their availability, are polyamide resins containing reactive amine groups spaced along their chains, e.g., the fatty polyamides derived from dimerized linoleic acid and polyamines, exemplified by the Versamid® resins sold by General Mills, Inc. Poly(vinylpyridines) are also preferred because they give elements with high photospeeds.

As stated above, other neutral, ethylenically unsaturated, addition-polymerizable monomer units can be present in the structure of the polymeric component, provided, however, that there is always present at least about 0.025 equivalent of salt-forming group per 1000 grams of polymer. Examples of suitable neutral monomer units include: those having one ethylenic double bond, such as the monoolefins, e.g., ethylene, isobutylene; neutral acrylyl and α-substituted acrylyl compounds, e.g., the acrylic esters, nitriles and amides, such as acrylonitrile, methyl methacrylate, cyclohexyl methacrylate; vinyl and vinylidene halides, e.g., vinyl chloride; fluorinated ethylenes, e.g., vinyl fluoride, vinylidene fluoride, tetrafluoroethylene; vinyl carboxylates, e.g., vinyl acetate, vinyl trimethylacetate, vinyl formate; vinyl aryls, e.g., styrene and vinylnaphthalene; and other polymerizable monoethylenically unsaturated monomers, such as the ketones and ethers, e.g., methyl vinyl ketone, vinyl ethyl ether, and the like. Other useful neutral units are polymerizable monomer units with a plurality of ethylenic double bonds, conjugated or not, such as dienes, e.g., butadiene, 2-chlorobutadiene, 2-fluorobutadiene; -ene/-yne type monomers, such as monovinylacetylene and divinylacetylene; and neutral ester of fumaric, maleic, itaconic, and citraconic acids. Also useful as neutral monomeric units are carbon monoxide and sulfur dioxide. It is particularly preferred to employ homopolymers and copolymers of monomers containing salt-forming groups consisting essentially of carboxyl groups and primary, secondary and tertiary amine groups.

It is not necessary that the salt-forming polymer contain only acidic salt-forming groups or only basic salt-forming groups. The polymer can contain both acidic and basic salt-forming groups. For example, copolymers of methacrylic acid and 2-vinylpyridine may be employed as the polymeric component.

The second essential component of the photopolymerizable compositions of this invention is at least one addition polymerizable, nongaseous, ethylenically unsaturated compound having at least one complementary salt-forming group. The amount of unsaturated compound present should be such that the ratio of equivalents of complementary salt-forming groups in the unsaturated component to equivalents of salt-forming groups in the polymer component is about 1:2 to about 50:1. Since the salt-forming reaction is generally an equilibrium, the relative amounts of salt-forming polymeric and monomeric components will vary widely depending on the relative acid and base strengths of the salt-forming radicals or groups involved, and also the degree of ionic cross-links it is desired to establish in the final product. Both the relative salt-forming strength and the degree of stoichiometric excess will be higher as the desired degree of ionic cross-links increases, and vice versa. Thus, with a relatively weakly acidic or basic polymer, a strong complementary salt-forming monomer will be used. Preferably, the ratio of equivalents of complementary salt-forming groups in the unsaturated component to equivalents of salt-forming groups in the polymer component is about 1:1 to about 15:1.

When the polymeric component contains acidic groups as the salt-forming groups, the complementary salt-forming monomer required will contain a basic group, such as the basic primary, secondary or tertiary amine groups. Conversely, when the polymeric component contains basic amino groups as the salt-forming groups, the requisite complementary salt-forming monomer will carry one or more acidic carboxylic, phosphonic, sulfonic, sulfate or phosphate groups. It is obvious, therefore, that the requisite complementary salt-forming monomers correspond in reverse to the monomers of the previously listed polymers. For instance, when the polymeric component is one containing a plurality of lateral carboxylic acid substituents, such as a polymer of acrylic acid, the requisite complementary salt-forming monomer will generally be one of the ethylenically unsaturated addition-polymerizable basic amines, e.g., p-(β-diethylaminoethyl)styrene, dimethylaminoethyl methacrylate, 4-vinylpyridine, and the like. Conversely, when the polymeric component contains a plurality of basic amino groups, e.g., a polymer of 4-vinylpyridine, the requisite complementary salt-forming monomer component will contain acidic groups, e.g., carboxylic acid groups, such as acrylic acid, methacrylic acid, itaconic acid, cinnamic acid, and the like. These addition-polymerizable salt-forming monomers are capable of forming high polymers by photoinitiated addition polymerization in the presence of an addition-polymerization initiator therefor which is activatable by actinic radiation.

Particularly preferred ethylenically unsaturated compounds include those which contain carboxyl groups, or primary, secondary, or tertiary amine groups. Suitable unsaturated compounds include the monomer forms of the polymers listed above.

The combined concentration of the salt-forming polymer and the complementary salt-forming monomer should be about 25 to about 90% by weight, based on the combined total of the salt-forming polymer, the complementary salt-forming monomer, and the ethylenically unsaturated diester polyhydroxy polyether. Preferably these two components are about 25 to about 85% by weight of the combined total of the three specified components.

The third essential component of the photopolymerizable compositions of this invention is at least one ethylenically unsaturated diester polyhydroxy polyether of the structure

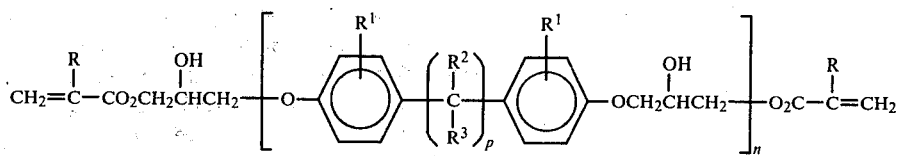

where R is H or CH₃; R¹ is H or an alkyl group of 1-4 carbon atoms and preferably H; n is 1-15 and preferably 1-4; p is 0 or 1 and preferably 1; and when p is 1, R² is H or CH₃ and preferably CH₃, R³ is H, CH₃ or C₂H₅ and preferably CH₃. Diesters of the preferred compositions are commercially available, and the bis-epoxide precursors of the longer chain diesters are commercially available from various sources as epoxy resins. The ethylenically unsaturated diesters are described in U.S. Pat. Nos. 3,661,576; 3,373,075 and 3,637,618. These diesters may be prepared by reaction of two moles of acrylic or methacrylic acid with one mole of a suitable diepoxy compound in the presence of a tertiary amine catalyst and a vinyl polymerization inhibitor.

The concentration of the ethylenically unsaturated diester polyhydroxy polyether component should be about 10 to about 75% by weight based on the combined total of the salt-forming polymer, the complementary salt-forming monomer, and the ethylenically unsaturated diester polyhydroxy polyether components. Preferably, the ethylenically unsaturated diester polyhyroxy polyether is present in the amount of about 15 to about 75% by weight of the combined total of the three specified components.

The fourth essential component of the photopolymerizable composition is a free-radical generating system, activatable by actinic radiation, which initiates polymerization of the unsaturated compounds and does not subsequently terminate the polymerization. The free-radical generating system should be present in the amount of about 1 to about 20% by weight based on the total photopolymerizable composition, and preferably about 5 to about 18%.

The free-radical generating system should have at least one component that has an active radiation absorption band with a molar extinction coefficient of at least about 50 within the range of about 2000-8000 Å, preferably about 2500-5000 Å. "Active radiation absorption band" means a band of radiation which is active to produce the free radicals necessary to initiate polymerization of the unsaturated compounds. The free-radical generating system can comprise one or more compounds which directly furnish free radicals when activated by radiation. It can also comprise a plurality of compounds, one of which yields the free radicals after having been caused to do so by a sensitizer which is activated by the radiation.

A large number of such compounds can be utilized in the practice of the invention and include aromatic ketones such as benzophenone, Michler's ketone (4,4'-bis(dimethylamino)benzophenone), 4,4'-bis(diethylamino)benzophenone, 4-acryloxy-4'-dimethylaminobenzophenone, 4-acryloxy-4'-diethylaminobenzophenone, 4-methoxy-4'-dimethylaminobenzophenone, 2-ethylanthraquinone, phenanthraquinone, 2-t-butylanthraquinone, 1,2-benzanthraquinone, 2,3-benzanthraquinone, 2,3-dichloronaphthoquinone, sodium salt of anthraquinone α-sulfonic acid, and other aromatic ketones; benzoin, benzoin ethers such as benzoin methyl ether, benzoin isopropyl ether and benzoin phenyl ether, methyl-benzoin, ethylbenzoin and other benzoins; and 2,4,5-triarylimidazolyl dimers such as 2-(o-chlorophenyl)-4,5-diphenylimidazolyl dimer, 2-(o-chlorophenyl)-4,5-di(m-methoxyphenyl)imidazolyl dimer, 2-(o-fluorophenyl)-4,5-diphenylimidazolyl dimer, 2-(o-methoxyphenyl)-4,5-diphenylimidazolyl dimer, 2-(p-methoxyphenyl)-4,5-diphenylimidazolyl dimer, 2,4-di(p-methoxyphenyl)-5-phenylimidazolyl dimer, 2-(2,4-dimethoxyphenyl)-4,5-diphenylimidazolyl dimer, 2-(p-methylmercaptophenyl)-4,5-diphenylimidazolyl dimer, and the like disclosed in U.S. Pat. Nos. 3,479,185 and 3,784,557 and in British Pat. Nos. 997,396 and 1,047,569.

The imidazolyl dimers may be used with a free-radical producing hydrogen or electron donor such as 2-mercaptobenzoxazole, 2-mercaptobenzthiazole, Leuco Crystal Violet or tris(4-diethylamino-2-methylphenyl)methane. Such sensitizers as Michler's ketone may be added. Various energy transfer dyes such as Rose Bengal and Eosin Y can also be used. Additional examples of suitable initiators are disclosed by Plambeck in U.S. Pat. No. 2,760,863. Redox systems may also be used. These include combinations such as Rose Bengal/2-dibutylaminoethanol; phenanthrenequinone/triethanolamine; 2(o-chlorophenyl)-4,5-di(m-methoxyphenyl)imidazolyl dimer/2-mercaptobenzoxazole; 2(o-chlorophenyl)4,5-diphenylimidazolyl dimer/2,5-bis(4'-diethylamino-2'-methylbenzylidene)cyclopentanone; and the like.

The preferred initiating systems employ triarylimidazolyl dimers, and a free-radical producing electron donor, with or without the use of sensitizing compounds as described in U.S. Pat. No. 3,479,185 to Chambers. The 2,4,5-triphenylimidazolyl dimers having an ortho substituent on the 2-phenyl ring are particularly useful as components of the initiating system because of their stability. Such dimers are 2-(o-chlorophenyl)-4,5-diphenylimidazolyl dimer, 2-(o-fluorophenyl)-4,5-diphenylimidazolyl dimer, 2-(o-methoxyphenyl)-4,5-diphenylimidazolyl dimer, and 2-(o-chlorophenyl)-4,5-di(m-methoxyphenyl)imidazolyl dimer.

Particularly preferred as initiating systems are a combination of at least one 2,4,5-triarylimidazolyl dimer and at least one p-aminophenyl ketone. Such systems are described in U.S. Pat. No. 3,549,367 to Chang et al. The p-aminophenyl ketone can be represented by the formula

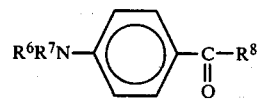

where R⁶ and R⁷ are each hydrogen, a lower alkyl group of 1-4 carbon atoms, or together with the shown nitrogen form a morpholino ring, and R⁸ is alkyl of 1-4 carbon atoms, monocarbocyclic aryl, preferably phenyl or substituted phenyl, and preferably a

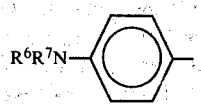

group.

Suitable p-aminophenyl ketones which may be employed are described in U.S. Pat. No. 3,552,973 to Fishman. Particularly preferred in Michler's ketone.

In addition, the photopolymerizable compositions, especially when used in the preparation of lithographic printing plates, may and preferably do contain a colorant and/or a color producing agent, e.g., a leuco dye. The amine-substituted leuco dyes can function both in the role of a color-forming agent and a free-radical producing agent. Especially useful leuco dyes are those having at least one dialkylamino group. Also, any amine-substituted leuco triphenylmethane dye or various salts of the dye, e.g., the hydrochloride salt of the leuco dye, can be used. Examples of suitable dyes which can be used are listed in U.S. Pat. No. 3,549,367.

In addition to photoactive system components (1), (2), (3) and (4), the photopolymerizable compositions may also contain, optionally, 0 to about 70% by weight, based on the total photopolymerizable composition, of components which do not contribute to the photoactivity of the composition. For example, the compositions can contain a polymeric binder which can serve to strengthen the composition or adhere it to a substrate. Radiation-transparent and film-forming polymers are preferred. Examples of suitable binders are thermoplastic macromolecular organic polymers which have number average molecular weights of at least about 1500, preferably at least about 4000, including such polymer types as (a) copolyesters based on terephthalic, isophthalic, sebacic, adipic and hexahydroterephthalic acids; (b) nylons or polyamides; (c) vinylidene chloride copolymers; (d) ethylene/vinyl acetate copolymers; (e) cellulosic ethers; (f) synthetic rubbers; (g) cellulose esters; (h) polyvinyl esters including polyvinyl acetate/acrylate and polyvinyl acetate/methacrylate copolymers; (i) polyacrylate and α-alkylpolyacrylate esters, e.g., polymethyl methacrylate, polyethyl methacrylate, and methyl methacrylate/ethyl acrylate copolymers; (j) high molecular weight polyethylene oxides of polyglycols having average molecular weights of about 4000-1,000,000; (k) polyvinyl chloride and copolymers; (l) polyvinyl acetal; (m) polyurethanes; (n) polycarbonates; (o) polystyrenes; and the like.

Although thermoplastic binders are normally employed, there can be added in addition to or instead of said binders nonthermoplastic polymeric compounds to improve certain desirable characteristics, e.g., adhesion to the base support, adhesion to the image-receptive support on transfer, wear properties, chemical inertness, etc. Suitable nonthermoplastic polymeric compounds include polyvinyl alcohol, cellulose, anhydrous gelatin, phenolic resins and melamineformaldehyde resins, etc. When binders are employed, they are present in amounts between about 5% and 70%, preferably about 20 to about 50%, by weight of the total polymerizable composition.

If desired, the photopolymerizable composition can also contain immiscible polymeric or nonpolymeric organic fillers or reinforcing agents which are essentially transparent at the wavelengths used for the exposure, e.g., the organophilic silicas, bentonites, silica, powdered glass and colloidal carbon, as well as various types of pigments. Such materials are used in amounts varying with the desired properties of the photopolymerizable composition. The fillers are useful in improving the strength of the compositions, reducing tack, and, in addition, as coloring agents. Other soluble additives which may also be employed include dyes and dispersing agents. A number of such ingredients are listed in U.S. Pat. Nos. 2,760,863; 3,060,026; and 3,203,805.

With certain polymers, it may be desirable to add a plasticizer to give flexibility to the resulting photopolymerizable layer and facilitate selective development. Suitable plasticizers include polyethylene glycols and related materials such as substituted phenol/ethylene oxide adducts, e.g., the polyethers obtained from o-, m-, and p-cresol, o-, m-, and p-phenylphenol and p-nonylphenol, including commercially available materials such as the alkyl phenoxypolyoxyethylene ethanols. Other plasticizers include the acetates, propionates, butyrates, caprylates and other carboxylate esters of ethylene glycol, diethylene glycol, glycerol, triethylene glycol, pentaerythritol, and other polyhydric alcohols, and alkyl and aryl phosphates such as tributyl phosphate, trihexyl phosphate, trioctyl phosphate, triphenyl phosphate, tricresyl phosphate and cresyl diphenyl phosphate.

In order to prevent addition polymerization prior to use, there may be incorporated in the compositions a minor amount, for example, about 1-500 parts per million, based on the total photopolymerizable composition, of a stabilizer which prevents addition polymerization, e.g., hydroquinone, tertiary-butyl catechol, butylated hydroxytoluene, the nitroso dimer inhibitor systems described in British Pat. No. 1,453,681, etc. Such stabilizers improve the storage stability of the photopolymerizable elements by preventing premature thermal polymerization or polymerization induced by accidental exposure to adventitious radiation. It is also possible to employ the nitroaromatic compound photoinhibitor sources described in Belgium Pat. No. 852,517 in these compositions.

The photopolymerizable elements may have antihalation material beneath the photopolymerizable layer. For instance, the substrate may contain an antihalation material or have a layer or stratum of such material on its surface. The antihalation layer intermediate between the photopolymerizable layer and the substrate when used must have adequate adhesion to the substrate and the photopolymerizable layer and not react with the radiation-adsorptive material. Antihalation pigments and resin carriers are described in British Pat. No. 1,366,769.

The photopolymerizable layers described herein may be applied to a wide variety of substrates. By "substrate" is meant any natural or synthetic support, preferably one which is capable of existing in a flexible or rigid film or sheet form. For example, the substrate can be a metal sheet or foil, e.g., copper, a sheet or film of synthetic organic resin, cellulose paper, fiberboard, and the like, or a composite of two or more of these materials. Suitable substrates include those described in U.S. Pat. Nos. 2,760,863; 3,060,026 and 3,458,311, including substrates bearing the various antihalation layers and adherent sublayers described therein. Preferred substrates are thin, flexible, and have a hydrophilic or hydrophobic surface, e.g., grained aluminum sheets, steel sheets, copper sheets, polyvinylidene chloride copolymer-coated oriented polyester film, and gelatin-coated oriented polyester film.

The particular substrate will generally be determined by the use application involved. For example, the photopolymerizable compositions of this invention are particularly useful for the preparation of lithographic plates when an aluminum substrate is used. Aluminum substrates are available commercially in a wide variety of thicknesses. The aluminum may be untreated (except for the thin layer of oxide which forms immediately at its surface when exposed to air) or it may have been provided with surface treatments or coatings to leave a hydrophilic or hydrophobic surface. The surface can be roughened (mechanically, chemically, or electrochemically) to improve retention of liquids and to improved adhesion to strata to be applied thereon.

The photopolymerizable compositions of this invention provide photopolymerizable elements which are unusually low in sensitivity to inhibition of polymerization by oxygen, and, as a result of this phenomenon in combination with the high photospeed, satisfactory images can often be obtained by exposure of the element to radiation in the presence of air. Nevertheless, it is sometimes desirable to increase imaging speeds even higher, and imaging in vacuum or the use of a topcoat or protective stratum for the element may be employed. Such top-coats should be transparent to actinic radiation, substantially impermeable to oxygen and preferably permeable to water. Suitable coatings have been previously described, e.g., in U.S. Pat. No. 3,458,311, and in British Pat. Nos. 1,148,362, and 1,303,578.

The photopolymerizable composition is usually applied to the substrate as a solution or dispersion in a carrier solvent. The solution or dispersion may be sprayed, brushed, applied by a roller or an immersion coater, flowed over the surface, picked up by immersion or applied to the substrate by other suitable means. The solvent is then allowed to evaporate. In general, solvents are employed which are volatile at ordinary pressures. Examples of suitable solvents include water; amides such as N,N-dimethylformamide and N,N-dimethylacetamide; alcohols and ether alcohols such as methanol, ethanol, 1-propanol, 2-propanol, butanol, ethylene glycol, 2-butoxyethanol, and 2-ethoxyethanol; esters such as methyl acetate and ethyl acetate; aromatic hydrocarbons and aromatic halocarbons such as benzene, o-dichlorobenzene and toluene; ketones such as acetone, 2-butanone, and 3-pentanone; aliphatic halocarbons such as 1,1,1-trichloroethane, methylene chloride, chloroform, 1,1,2-trichloroethane, 1,1,2,2-tetrachloroethane, 1,1,2-trichloroethylene; miscellaneous solvents such as dimethyl sulfoxide, pyridine, tetrahydrofuran, 1,2-dimethoxyethane, dioxane, dicyanocyclobutane, N-methylpyrrolidone; and mixtures of these solvents in various proportions as may be required to attain solutions. After drying, the photopolymerizable layer has a thickness in the range from a coating weight of about 1 mg/dm$^2$ to about 5 mils or more in thickness.

The photopolymerizable compositions of this invention are exposed imagewise to actinic radiation, a portion of which contains wavelengths of about 2000–8000 Å, and preferably of about 2500–5000 Å. Imagewise exposure is preferably through an imagebearing transparency. Suitable sources of such radiation include ordinary sunlight and artificial sources such as sunlamps, pulsed and continuous xenon flash lamps, tungsten-halogen lamps, germicidal lamps, ultraviolet lamps providing specifically radiation of short wavelength (2537 Å), and lamps providing radiation of longer wavelengths, narrow or broad band, centered near 3600 Å, 4200 Å, 4500 Å, or 5000 Å, such as fluorescent lamps, mercury, metal additive, and arc lamps. Argon glow lamps, photographic flood lamps, lasers and fluorescent radiation sources such as the tracings on the face of a cathode ray tube may also be used. Electron accelerators and electron beam sources through an appropriate mask are also suitable. Of these, the mercury-vapor lamps, particularly the sun lamp or "black light" type, the fluorescent sun lamps, the xenon flash lamps, and the tungsten-halogen lamps are the most preferred.

The radiation exposure times may vary from fractions of a second to minutes, depending upon the intensity and spectral energy distribution of the radiation used, its distance from the photopolymerizable layer, and the nature and amounts of the unsaturated compounds in the layer. Customarily, a distance of about 1.5 to 60 inches (3.8–153 cm) from the photopolymerizable layer is used. Exposure temperatures are not particularly critical, but it is preferred to operate at about ambient temperatures or slightly higher, i.e., about 20° to about 50° C.

Imagewise exposure is conveniently carried out by exposing the photopolymerizable element to actinic radiation through a process transparency; that is, an image-bearing transparency consisting of areas substantially opaque and substantially transparent to the radiation being used, where the opaque areas may be substantially of the same optical density; for example, a so-called line or halftone negative or positive. Suitable process transparencies also include those with a graded range of opaque areas; for example, a continuous tone negative. Process transparencies may be constructed of any suitable materials including cellulose acetate film and polyester film.

After exposure, the image is developed. Development may be by toning, i.e., dusting with a fine pigment which selectively adheres to the tacky unhardened areas, by dye imbibition or by modulation of diffusion. Generally, however, the portions of the layer corresponding to the unexposed portions are removed, e.g., in lithographic applications. This method of development may be achieved by pressure transfer, differential adhesion of the exposed versus unexposed areas, use of peel apart transfer, and, preferably, by solvent washout. The solvent liquid used for development should have good solvent action on the linear (noncross-linked) salt-forming polymer and the nonpolymerized portions of the composition, and little action on the insolubilized image in the time required to remove the soluble portions.

When an organic polymer binder which contains acid or water-soluble salt groups is employed, an aqueous basic solvent is preferably used for development. Preferred solvents include aqueous base to which is added a water-soluble organic solvent, e.g., isopropyl alcohol, 2-ethoxyethanol, 2-butoxyethanol, 2-(2-butoxyethoxy)ethanol, and glycerol. Water is a useful solvent for many photopolymerizable compositions and it can be admixed with the solvents just mentioned. Mixtures of chlorinated aliphatic hydrocarbons such as dichloromethane, chloroform, carbon tetrachloride, and 1,1,1-trichloroethane with methanol are also useful solvents.

BEST MODE

The following are illustrative examples of the invention in which all parts and percentages are by weight and all degrees are Celsius unless otherwise stated.

The ethylenically unsaturated diester polyhydroxy polyethers employed in the Examples are commercially available from the Shell Chemical Company under the name Epocryl ® Resins. They have an n value of about 1.1, $R^2$ and $R^3=CH_3$, $R^1=H$ and $p=1$; Epocryl ® 12 is a dimethacrylate ester ($R=CH_3$), and Epocryl ® 303.1 and DRH-303 are diacrylate esters ($R=H$).

Versamid ® 125 is an amine-containing polyamide sold by General MIlls, Inc. which has a viscosity of 80–120 poise at 40° and an amine value of 290–320 corresponding to about 5.3 equivalents of amine per 1000 grams of polymer.

Versamid ® 100 is an amine-containing polyamide sold by General Mills, Inc. which has a viscosity of 10–15 poise at 150° and an amine value of 89–93 corresponding to about 1.6 equivalents of amine per 1000 grams of polymer.

The poly(2-vinylpyridine) employed in the examples has a number average molecular weight of about 35,000 and contains about 9.5 equivalents of amine per 1000 grams of polymer.

The aluminum substrates employed for spin-coating at 1000 and 2000 rpm were 3×3 inch (7.6×7.6 cm) plates unless specified otherwise. All spincoating weights are in the range of 10–40 mg/dm².

EXAMPLE 1

A mixture of 2.5 parts of polyamide resin (Versamid ® 125), 4.0 parts of itaconic acid, 1.0 part of Epocryl ® 12, 0.3 part of benzophenone, 0.3 part of 2-(o-chlorophenyl)-4,5-diphenylimidazolyl dimer, 0.25 part of Michler's ketone and 0.05 part of C.I. Solvent Red Dye #109 was dissolved in a mixture of 20 parts of methanol and 10 parts of 2-butoxyethanol. The solution was spin-coated onto anodized aluminum substrates (2000 rpm for 0.75 min). The coatings were exposed in air to a 275 watt sunlamp held 7.5 inches (19.1 cm) away from the samples through a 21-step stepwedge process transparency in which the transmittance of radiation between steps differs by a factor of $\sqrt{2}$. The exposed plates were developed for 10 seconds in water, and the last discernible step was determined for each exposure time. The results are summarized in Table I.

TABLE I

| Exposure Time, (sec) | Number of Polymer Steps |
| --- | --- |
| 1 | 3 |
| 2 | 4 |
| 5 | 6 |
| 10 | 8 |

The plate exposed for 1 second was dampened with AGE (asphaltum gum arabic emulsion, Pitman Company), dampened with fountain solution, and then inked with a standard black lithographic printing ink to give a good print after pressing directly on paper. Hence the combination of a polyamine, a carboxyl-containing ethylenically unsaturated compound, and an unsaturated diester polyhydroxy polyether gives an extremely rapid imaging system.

EXAMPLE 2

A mixture of 1.25 parts of polyamide resin (Versamid ® 125), 2.0 parts of itaconic acid, 2.0 parts of Epocryl ® 303.1, 0.3 part of benzophenone, 0.3 part of 2-(o-chlorophenyl)-4,5-diphenylimidazolyl dimer, 0.25 part of Michler's ketone, and 0.05 part of C.I. Solvent Red Dye #109 was dissolved in a mixture of 20 parts of methanol and 10 parts of 2-butoxyethanol. The solution was coated, and the coated plates were exposed and developed as described in Example 1. The results are summarized in Table II.

TABLE II

| Exposure Time, (sec) | Number of Polymer Steps |
| --- | --- |
| 1 | 7 |
| 5 | 8 |
| 10 | 8 |

EXAMPLE 3

A mixture of 0.62 part of polyamide resin (Versamid ® 125), 1.0 part of itaconic acid, 4.0 parts of Epocryl ® 303.1, 0.3 part of benzophenone, 0.3 part of 2-(o-chlorophenyl)-4,5-diphenylimidazolyl dimer, 0.25 part of Michler's ketone and 0.05 part of C.I. Solvent Red Dye #109 was dissolved in a mixture of 20 parts of methanol and 10 parts of 2-butoxyethanol. The solution was coated at 1000 and 2000 rpm (0.75 min), and the coated plates were exposed as described in Example 1. The exposed plates were developed for 10 seconds in a mixture of 60 parts of water and 40 parts of 2-propanol, and the results are summarized in Table III.

TABLE III

| Exposure Time, (sec) | Spin-Coating Speed (rpm) | Number of Polymer Steps |
| --- | --- | --- |
| 1 | 1000 | 7 |
| 10 | 1000 | 8 |
| 1 | 2000 | 4–6 |
| 10 | 2000 | 7 |

One of the plates coated at 2000 rpm was exposed through the stepwedge process transparency for 1 second to direct sunlight, and the exposed plate was developed for 10 seconds in the 40% aqueous 2-propanol solution. A total of 6–7 polymer steps were visible. The plate was treated with AGE, buffed dry, treated with fountain solution, and then inked with a standard black lithographic printing ink. Excellent prints were obtained by direct printing on paper.

EXAMPLE 4

A mixture of 0.62 part of polyamide resin (Versamid ® 125), 1.07 parts of itaconic acid, 4.0 parts of Epocryl ® 303.1, 0.3 part of benzophenone, 0.3 part of 2-(o-chlorophenyl)-4,5-diphenylimidazolyl dimer, 0.25 part of Michler's ketone, 0.05 part of C.I. Solvent Red Dye #109, and 1.0 part of a 9:1 copolymer of methyl methacrylate and methacrylic acid binder was dissolved in a mixture of 20 parts of methanol and 10 parts of 2-butoxyethanol. The solution was spincoated onto anodized aluminum substrates (2000 rpm; 0.75 min) to give coating weights of 21.7–21.8 mg/dm². The plates were exposed as described in Example 1, and the exposed plates were developed for 10 seconds in a mixture of 60 parts of water and 40 parts of 2-propanol followed by a water rinse. The results are summarized in Table IV. Although excellent images were obtained, considerable background color was present.

TABLE IV

| Exposure Time, (sec) | Number of Polymer Steps |
|---|---|
| 1 | 2 |
| 5 | 5 |
| 10 | 7 |

The minimum imaging energy of this formulation was found to be below 0.5 millijoule/cm$^2$, measured by exposing photopolymer coated plates in a spectral sensitometer. The minimum imaging energy was taken as the lowest energy that would produce a discernible image after exposure and development of the photopolymer plate. The light intensity was measured using a YSI Model 65 radiometer. Time of irradiation was controlled by a calibrated shutter.

EXAMPLE 5

A mixture of 15 parts of a binder (9:1 copolymer of methyl methacrylate and methacrylic acid), 15 parts of Epocryl® 303.1, 1.2 parts of 2-(o-chlorophenyl)-4,5-diphenylimidazolyl dimer and 0.9 part of Michler's ketone was dissolved in 128.4 parts of 2-ethoxyethanol. This solution was designated Solution A. A second solution (designated Solution B) was prepared by dissolving 0.78 parts of itaconic acid in a mixture of 0.46 parts of polyamide resin (Versamid® 125) and 8.76 parts of 2-ethoxyethanol.

Coating solutions $C_1$, $C_2$, $C_3$ and $C_4$ were prepared by appropriate combinations of Solutions A and B with addition of sufficient 2-ethoxyethanol to maintain solids levels at 17.9% (Table V). The solutions were spin-coated onto anodized aluminum substrates (1000 rpm; 0.75 min), and the coated plates were exposed in a vacuum frame (27 inches of Hg, 60 seconds) through a 21-step $\sqrt{2}$ stepwedge process transparency to a 1000 watt tungsten-halogen lamp at a distance of 70 cm. The exposed plates were developed for 30 seconds in a solution of 0.8 part of sodium carbonate, 90 parts of distilled water, and 10 parts of 2-(2-butoxyethoxy)ethanol, followed by a water rinse. Coating solution $C_1$ was a control containing no complementary salt-forming groups. Coating solution $C_2$ was a control containing more than 75% polyether based on the polyamine, itaconic acid and polyether. The results are summarized in Table VI.

TABLE V

| Plate | Solution A, (parts) | Solution B, (parts) | Coating Weight, (mg/dm$^2$) | Salt-Forming, Components (%)[1] |
|---|---|---|---|---|
| $C_1$ (control) | 10 | 0 | 20.7 | 0 |
| $C_2$ (control) | 10 | 2 | 17.4 | 11 |
| $C_3$ | 10 | 3 | 11.2 | 16 |
| $C_4$ | 10 | 4 | 14.0 | 20 |

[1]Itaconic acid + polyamide; percent of total composition

TABLE VI

| Plate | Exposure Time, (sec) | Number of Polymer Steps |
|---|---|---|
| $C_1$ (control) | 10 | 1 |
| $C_1$ | 20 | 5 |
| $C_1$ | 40 | 9 |
| $C_1$ | 80 | 12 |
| $C_2$ (control) | 10 | 1 |
| $C_2$ | 20 | 4 |
| $C_2$ | 40 | 9 |
| $C_2$ | 80 | 13 |
| $C_3$ | 10 | 6 |
| $C_3$ | 20 | 8 |
| $C_3$ | 40 | 11 |
| $C_3$ | 80 | 13 |
| $C_4$ | 10 | 6 |
| $C_4$ | 20 | 8 |
| $C_4$ | 40 | 12 |
| $C_4$ | 80 | 13 |

EXAMPLE 6

To 20 parts of methanol was added 2.50 parts of polyamide resin (Versamid® 125); to this solution was added 4.00 parts of itaconic acid, the solution was stirred 5 minutes, and then were added 0.33 part of 2-(o-chlorophenyl)-4,5-diphenylimidazolyl dimer, 0.25 part of Michler's ketone, and 8.32 parts of 2-butoxyethanol (Solution A; Control). A second solution was prepared similarly from the following components: 0.62 part of polyamine (Versamid® 125), 15 parts of methanol, 1.00 part of itaconic acid, 0.28 part of 2-(o-chlorophenyl)-4,5-diphenylimidazolyl dimer, 0.21 part of Michler's ketone, 4.00 parts of Epocryl® DRH-303, and 9.44 parts of 2-ethoxyethanol (Solution B). Solutions A and B were spin-coated onto anodized aluminum substrates (2000 rpm; 0.75 min; coating weight, 18.6 mg/dm$^2$); and the coated plates were exposed in air through a 21-step $\sqrt{2}$ stepwedge process transparency to a 1000 watt tungsten-halogen lamp at a distance of 70 cm. Exposed Plates A from Solution A were developed for 30 seconds in a solution of 79 parts of distilled water, 40 parts of 2-propanol and 1 part of acetic acid. Exposed Plates B from Solution B were developed for 30 seconds in a solution of 60 parts of distilled water and 40 parts of 2-(2-butoxyethoxy)ethanol. Plates C were prepared like Plates B except that they were overcoated with a 4% aqueous solution of polyvinyl alcohol by spin-coating at 3000 rpm before exposure; overcoating weight, 2.2 mg/dm$^2$. The results are summarized in Table VII.

TABLE VII

| Plate | Exposure Time, (sec) | Number of Polymer Steps |
|---|---|---|
| A (control) | 1 | 1 |
| A | 4 | 6 |
| A | 16 | 7 |
| B | 1 | 4 |
| B | 4 | 8 |
| B | 16 | 9 |
| C | 1 | 12 |
| C | 4 | 13 |
| C | 16 | >14 |

Hence the photopolymerizable layer which contains both the Epocryl® and the Versamid®/itaconic acid components is 2-3 steps faster than the Control composition without Epocryl®. The minimum imaging energy of Plate C was found to be about 0.04 millijoule/cm$^2$, measured as described in Example 4.

EXAMPLE 7

Mixtures of 0.62 part of polyamide resin (Versamid® 125), 0.28 part of 2-(o-chlorophenyl)-4,5-diphenylimidazolyl dimer, 0.21 part of Michler's ketone, 2.00 parts of Epocryl® DRH-303, and 7.7 millimoles of an acid listed in Table VIII were dissolved in a mixture of 10 parts of methanol and 8.72 parts of 2-ethoxyethanol. The solutions were spin-coated (2000 rpm; 0.75 min); and the coated plates were exposed through a 21-step √2 stepwedge process transparency, either in air or in a vacuum frame (27 inches of Hg, 60 seconds), to a 1000-watt tungsten-halogen lamp at a distance of 70 cm. The exposed plates were developed for 30 seconds in a solution of 60 parts of distilled water and 40 parts of 2-(2-butoxyethoxy)ethanol followed by a water rinse. Well-defined images were obtained in all cases, and the results are summarized in Table VIII.

TABLE VIII

| Carboxylic Acid | Exposure Time, (sec) | Number of Polymer Steps | |
|---|---|---|---|
| | | Air | Vacuum |
| Sorbic (0.86 part) | 1 | Faint Image | 2 |
| | 4 | 4 | 6 |
| | 16 | 6 | 10 |
| | 64 | 6 | 12 |
| Aconitic (1.34 parts) | 1 | — | Faint Image |
| | 4 | 1 | 3 |
| | 16 | 4 | 8 |
| | 64 | 4 | 9 |
| Crotonic (0.74 part) | 1 | — | — |
| | 4 | Faint Image | 1 |
| | 16 | 2 | 10 |
| | 64 | 6 | 13 |

EXAMPLE 8

A mixture of 0.62 part of polyamide resin (Versamid® 125), 1.00 part of itaconic acid, 0.28 part of 2-(o-chlorophenyl)4,5-diphenylimidazolyl dimer, 0.21 part of Michler's ketone, and 4.00 parts of bisphenol-A epoxymethacrylate resin, prepared by reacting one molar equivalent of a commercially available epoxy resin (n=14, prepared from bisphenol-A and epichlorohydrin) with two molar equivalents of methacrylic acid, was dissolved in 14.44 parts of 2-ethoxyethanol. The solution was spin-coated onto anodized aluminum substrates (2000 rpm, 0.75 min), and the coated plates were exposed as described in Example 7. The exposed plates were spray-developed for 30 seconds in a solution of 30 parts of distilled water and 70 parts of 2-(2-butoxyethoxy)ethanol, and the results are summarized in Table IX.

TABLE IX

| Exposure Time, (sec) | Number of Polymer Steps | |
|---|---|---|
| | Air | Vacuum |
| 1 | — | Faint Image |
| 4 | Faint Image | 2 |
| 16 | ~4 | 8 |
| 64 | ~6 | 12 |

EXAMPLE 9

To a stirred solution of 1.24 parts of polyamide resin (Versamide® 100) in 30.0 parts of methanol was added 2.00 parts of itaconic acid in small portions. After 5 minutes, 0.56 part of 2-(o-chlorophenyl)-4,5-diphenylimidazolyl dimer, 0.42 part of Michler's ketone, 8.00 parts of Epocryl® DRH-303, and 18.88 parts of 2-ethoxyethanol were added. The solution was spin-coated onto anodized aluminum substrates (2000 rpm, 0.75 min), and some of the plates were overcoated with a 4% aqueous solution of polyvinyl alcohol by spin-coating at 3000 rpm before exposure. All of the coated plates were exposed in air and developed as described in Example 7. The results are summarized in Table X.

TABLE X

| Exposure Time, (sec) | Number of Polymer Steps | |
|---|---|---|
| | Not Overcoated | Overcoated |
| 1 | 4 | 6 |
| 4 | 5 | 7 |
| 16 | 5 | 8 |
| 64 | 6 | 9 |

The overcoated plates were 2–3 steps faster than the plates which were not overcoated.

EXAMPLE 10

A mixture of 0.43 part of poly(2-vinylpyridine), 0.85 part of itaconic acid, 2.20 parts of Epocryl® DRH-303, 0.30 part of 2-(o-chlorophenyl)-4,5-diphenylimidazolyl dimer, and 0.20 part of Michler's ketone was dissolved in 18.13 parts of a solvent mixture (L-Solvent) prepared by mixing 180 parts of methylene chloride, 90 parts of 1,1,1-trichloroethane, 15 parts of methanol, and 15 parts of 2-ethoxyethanol. This solution was designated Solution A. Two additional solutions (B and C) were prepared which contained the components of Solution A, but with different quantities of poly(2-vinylpyridine) and solvent mixture, as follows.

Solution B: 0.21 part of poly(2-vinylpyridine) and 17.12 parts of L-Solvent

Solution C: 0.10 part of poly(2-vinylpyridine) and 16.67 parts of L-Solvent

The solutions were filtered and then spin-coated onto anodized aluminum substrates (2000 rpm, 0.75 min), and the coated plates were exposed in air and in vacuum as described in Example 7. The exposed plates were developed for 30 seconds in a solution of 30 parts of distilled water and 70 parts of 2-butoxyethanol. The results are summarized in Table XI.

TABLE XI

| Plate | Exposure Time, (sec) | Number of Polymer Steps | |
|---|---|---|---|
| | | Air | Vacuum |
| A | 1 | 6 | 6 |
| | 4 | 9 | 11 |
| | 16 | 13 | 11 |
| | 64 | ~11 | 13+ |
| B | 1 | 4 | 7 |
| | 4 | — | 10 |
| | 16 | 7 | 12 |
| | 64 | ~10 | 13+ |
| C | 1 | 8 | 9 |
| | 4 | 10 | 12 |
| | 16 | 11 | 13 |
| | 64 | 12 | 13+ |

EXAMPLE 11

A mixture of 0.43 part of poly(2-vinylpyridine), 0.30 part of 2-(o-chlorophenyl)-4,5-diphenylimidazolyl dimer, 0.20 part of Michler's ketone, and 0.78 part of 0.1% solution of hydroquinone in L-solvent (Example 10), was dissolved in 17.35 parts of a solvent mixture (M-solvent) prepared by mixing 10 parts of 2-propanol, 20 parts of 2-butoxyethanol, 20 parts of 1,1,1-trichloroethane, 10 parts of dimethylformamide, and 40 parts of methylene chloride. To this solution were added 0.85 part of itaconic acid, and 2.20 parts of the bisphenol-A epoxymethacrylate of Example 8, and the solution was designated Solution A. A second solution was prepared similar to Solution A except that the poly(2-vinylpyridine) was replaced with 0.43 part of poly(4-vinylpyridine) (Solution B). The solutions were spin-coated onto anodized aluminum substrates (2000 rpm, 0.75 min), and the coated plates were exposed in air and in vacuum as described in Example 7. The exposed plates were developed for 30 seconds in a solution of 80 parts of 2-butoxyethanol, 20 parts of distilled water and 1 part of sodium carbonate. The results are summarized in Table XII.

TABLE XII

| Plate | Exposure Time, (sec) | Number of Polymer Steps Air | Vacuum |
|---|---|---|---|
| A | 1 | — | 1 |
|   | 4 | 2 | 4 |
|   | 16 | 5 | 8 |
|   | 64 | 7 | 13 |
| B | 1 | 0 | 1 |
|   | 4 | 3 | 3 |
|   | 16 | 4 | 6 |
|   | 64 | 6 | 10 |

EXAMPLE 12

Solutions A, B and C were prepared from the materials shown in Table XIII.

TABLE XIII

| | Solution, (parts) | | |
|---|---|---|---|
| | A | B | C |
| Polyacid[1] | 3.00 | 2.00 | 2.50 |
| 4-Vinylpyridine | 1.20 | 2.20 | 1.70 |
| Epocryl ® DRH-303 | 2.00 | 2.00 | 2.00 |
| 2-(o-chlorophenyl)-4,5-diphenylimidazolyl dimer | 0.32 | 0.32 | 0.32 |
| Michler's Ketone | 0.24 | 0.24 | 0.24 |
| M-Solvent (Example 11) | 30.84 | 30.84 | 30.84 |

[1]9:1 copolymer of methyl methacrylate and methacrylic acid

The solutions were spin-coated onto anodized aluminum substrates (2000 rpm, 0.75 min), and the coated plates were exposed as described in Example 7. The exposed plates were developed for 30 seconds in a solution of 0.8 part of sodium carbonate, 90 parts of distilled water and 10 parts of 2-(2-butoxyethoxy)-ethanol, followed by a water rinse. The results are summarized in Table XIV.

TABLE XIV

| Plate | Exposure Time, (sec) | Number of Polymer Steps Air | Vacuum |
|---|---|---|---|
| A | 4 | —6 | — |
|   | 16 | 4 | 3 |
|   | 64 | 6 | 11 |
| B | 4 | — | 1 |
|   | 16 | — | 6 |
|   | 64 | — | 11 |
| C | 4 | — | — |
|   | 16 | 4 | 5 |
|   | 64 | 6 | 11 |

EXAMPLE 13

Example 12 was repeated except that in Solutions A, B, and C, the 4-vinylpyridine was replaced with the same amount of N,N-dimethylaminoethyl methacrylate in each case. The results are summarized in Table XV.

TABLE XV

| Plate | Exposure Time, (sec) | Number of Polymer Steps Air | Vacuum |
|---|---|---|---|
| A | 4 | 1 | — |
|   | 16 | 6 | 7 |
|   | 64 | 8 | 11 |
| B | 4 | 2 | 3 |
|   | 16 | 6 | 8 |
|   | 64 | 7 | 12 |
| C | 4 | 2 | 2 |
|   | 16 | 6 | 7 |
|   | 64 | 8 | 17 |

Sharp images were obtained. A plate prepared from Solution B, exposed in vacuum for 16 seconds (8 polymer steps), was dampened with fountain solution and inked with a standard black lithographic printing ink. A good hand print was obtained by direct contact of the inked plate with paper.

EXAMPLE 14

Solutions A and B were prepared from the materials shown in Table XVI.

TABLE XVI

| | Solution, (parts) (control) | |
|---|---|---|
| | A | B |
| Polyamide (Versamid ® 125 | 1.24 | 0.62 |
| Itaconic Acid | 2.00 | 1.00 |
| Benzophenone | 0.16 | 0.28 |
| Michler's Ketone | 0.12 | 0.21 |
| Epocryl ® DRH-303 | 0.00 | 4.00 |
| Methanol | 10.00 | 15.00 |
| 2-Ethoxyethanol | 4.08 | 9.44 |

The solutions were spin-coated onto anodized aluminum substrates (2000 rpm; 0.75 min), and the coated plates were exposed and developed as described in Example 7. The results are summarized in Table XVII.

TABLE XVII

| Plate | Exposure Time, (sec) | Number of Polymer Steps Air | Vacuum |
|---|---|---|---|
| A (control) | 1 | No Image | No Image |
|   | 4 | No Image | No Image |
|   | 16 | No Image | No Image |
|   | 64 | No Image | 1 |
| B | 1 | No Image | Faint Image |
|   | 4 | No Image | 4 |
|   | 16 | Faint Image | 7 |
|   | 64 | 1 | 8 |

The results show that the control plate without Epocryl ® was at least 7 steps slower than plate B of the invention.

EXAMPLE 15

To a solution of 1.62 parts of polyamide resin (Versamid ® 125) in 10.0 parts of methanol was added 2.61 parts of itaconic acid and the solution was stirred for 5 minutes. To this solution were added 3.14 parts of poly(methyl methacrylate) resin binder, 7.35 parts of Epocryl ® DRH-303, 0.73 part of 2-(o-chlorophenyl)-4,5-diphenylimidazolyl dimer, 0.55 part of Michler's ketone, and 74.0 parts of 2-ethoxyethanol. The solution was spin-coated onto anodized aluminum substrates (1000 rpm; 0.75 min), and the coated plates were exposed as described in Example 7. Some of the plates were overcoated with a 2% solution of polyvinyl alcohol in 3 parts of water and 1 part of methanol by spin-coating at 2000 rpm before exposure. The exposed plates were developed for 30 seconds in a solution of 70 parts of 2-butoxyethanol and 30 parts of distilled water. The results are summarized in Table XVIII.

TABLE XVIII

| Exposure Time, (sec) | Number of Polymer Steps | | | |
|---|---|---|---|---|
| | Not Overcoated | | Overcoated | |
| | Air | Vacuum | Air | Vacuum |
| 1 | 1 | 7 | 1 | 2 |
| 4 | 2 | 9 | 5 | 5 |
| 16 | 3 | 10 | 8 | 13 |
| 64 | 4 | 12 | 9 | >15 |

The unovercoated plate exposed for 4 seconds in vacuum (9 polymer steps) was treated with AGE, wet with water, and inked with a standard black lithographic printing ink. A sharp, dense hand print was obtained by direct contact of the inked plate with paper. Thus, addition of a hydrophobic binder gave a plate with excellent printing properties.

EXAMPLE 16

To a solution of 0.62 part of polyamide resin (Versamid ® 125) in 15.0 parts of methanol was added 1.00 part of itaconic acid and the solution was stirred for 5 minutes. To this solution were added 4.00 parts of Epocryl ® DRH-303, 0.28 part of 2-(o-chlorophenyl)-4,5-diphenylimidazolyl dimer, 0.21 part of Michler's ketone, 1.26 parts of a premilled mixture of a methyl methacrylate:ethyl acrylate:acrylic acid (37:57:7) terpolymer (molecular weight 260,000 and acid number 76–85) and carbon black (55/45), and 9.44 parts of 2-ethoxyethanol. The suspension was milled for 1 hour in a sand grinder and the sand was separated by filtration through nylon felt. The resulting dispersion was coated using a 2-mil doctor knife onto an oriented polyester film having a subcoating of gelatin which had been hardened, and the dried coating was overcoated with a 1.5% solution of polyvinyl alcohol, prepared by dilution of a 2% aqueous solution with methanol, by spin-coating at 2000 rpm. The coated film was exposed for 3 seconds under vacuum as described for the plates of Example 7. The exposed film was developed for 5 seconds in a solution of 70 parts of 2-propanol and 30 parts of distilled water, followed by a rinse in 2-propanol. The resulting litho film was dried and wiped with a pad soaked in 2-propanol to give a clean black image. Polymer steps 5–6 were obtained on the film.

EXAMPLE 17

To a solution of 0.25 part of polyamide resin (Versamid ® 125) and 0.50 part of itaconic acid in 9.72 parts of distilled water was added 1.00 part of polyvinyl alcohol (88% hydrolyzed) binder and a preground paste of 0.09 part of 2-(o-chlorophenyl)-4,5-diphenylimidazolyl dimer, 0.07 part of Michler's ketone, 0.50 part of Epocryl ® DRH-303, and 0.02 part of stearic acid. This mixture was milled for 0.5 hour in a sand grinder and the sand was separated by filtration through nylon felt. The resulting dispersion was coated using a 2-mil doctor knife onto an oriented polyester film having a subcoating of gelatin which had been hardened, and the dried film was exposed for 30 seconds under vacuum as described for the plates of Example 7. The exposed film was developed for 30 seconds in a solution of 0.8 part of sodium carbonate, 90 parts of distilled water, and 10 parts of 2-(2-butoxyethoxy)ethanol, followed by a rinse in water and then in 2-propanol. Images of the step-wedge numbers were visible on the exposed film.

EXAMPLE 18

A mixture of 1.24 parts of polyamide resin (Versamid ® 125), 2.00 parts of itaconic acid, 0.56 part of 2-(o-chlorophenyl)-4,5-diphenylimidazolyl dimer and 4.00 parts of Epocryl ® DRH-303 was dissolved in 31.2 parts of L-solvent (Example 10). To 10 parts of this solution was added 2.5 parts of 0.1% solution of 2,5-bis(4'-diethylamino-2'-methylbenzylidene)cyclopentanone (DBC) in L-solvent, and the resulting solution was spin-coated onto anodized aluminum substrates (2000 rpm, 0.75 min). The coated plates were overcoated with a 0.53% solution of polyvinyl alcohol prepared by mixing 1.0 part of an 8% aqueous solution with 9.0 parts of water, and 5.0 parts of methanol, by spin-coating at 2000 rpm. The coated plates were exposed in air as described in Example 7. The exposed plates were spray-developed for 30 seconds in a solution of 30 parts of distilled water and 70 parts of 2-(2-butoxyethoxy)ethanol, and the results are summarized in Table XIX.

TABLE XIX

| Exposure Time, (sec) | Number of Polymer Steps |
|---|---|
| 1 | 3 |
| 4 | 5 |
| 16 | 8 |
| 64 | 7 |

Since DBC absorbs radiation of 480 nm, the system of Example 18 was imaged with visible radiation.

EXAMPLE 19

A mixture of 0.10 part of poly(2-vinylpyridine), 0.85 part of itaconic acid, 2.20 parts of Epocryl ® DRH-303 and 0.28 part of benzoin isobutyl ether was dissolved in 13.72 parts of L-solvent (Example 10) and stirred for 16 hours. Insolubles were removed by filtration and the filtrate solution was spin-coated on aluminum plates at 2000 rpm. The plates were exposed in air and in vacuum as described in Example 7. The exposed plates were developed for 30 seconds in a solution of 70 parts of 2-butoxyethanol and 30 parts of water, followed by a water rinse. The images obtained are shown in Table XX.

TABLE XX

| Exposure Time (sec) | Number of Polymer Steps | |
|---|---|---|
| | Air | Vacuum |
| 4 | No Image | 3 |
| 16 | Faint Image | 4 |
| 64 | 3 | 4 |

EXAMPLE 20

A mixture of 0.10 part of poly(2-vinylpyridine), 0.85 part of itaconic acid, 2.20 parts of Epocryl ® DRH-303, 0.30 part of 2-(o-chlorophenyl)-4,5-diphenylimidazolyl dimer and 0.20 part of 2,5-bis(4'-diethylamino-2'-methylbenzylidene)cyclopentanone was dissolved in 18.13 parts of a solvent prepared from 180 parts of methylene chloride, 90 parts of 1,1,1-trichloroethane, 15 parts of methanol, and 15 parts of 2-butoxyethanol. The resulting solution was spin-coated onto aluminum plates at 2000 rpm. The dried plates were exposed to a traversing argon laser beam (wavelength 488 nm), developed for 30 seconds in 80/20 2-butoxyethanol/water and rinsed in water. Line images appeared where the beam had made multiple traverses of the stationary plate.

EXAMPLE 21

This example illustrates a peel apart imaging system.

A suspension of 0.50 part of polyamide resin (Versamid ® 125), 1.00 part of itaconic acid, 1.00 part of Epocryl ® DRH-303, 0.44 part of 2-(o-chlorophenyl)-4,-5-diphenylimidazolyl dimer, 0.40 part of 2-(o-chlorophenyl)-4,5-di(m-methoxyphenyl)imidazolyl dimer, 0.56 part of Michler's ketone, 1.80 parts of the polyacid of Example 12, as a binder, 2.00 parts of carbon black, 0.10 part of stearic acid, 0.21 part of a mixture of dispersants, 0.48 part of triethylene glycol dicaprylate plasticizer, and 0.10 part of 2-mercaptobenzthiazole in 25.17 parts of a solvent mixture (P-solvent) prepared by mixing 40 parts by volume of ethanol, 40 parts by volume of 1,1,1-trichloroethane and 10 parts by volume of 2-butoxyethanol, was milled in a sand grinder to disperse the pigment, and the sand was separated by filtration through coarse filter paper. The resulting dispersion was coated using a 1-mil doctor knife onto an oriented polyester film having a subcoating of gelatin which had been hardened, and the coating was air-dried. Two pieces of the film were laminated with coated surfaces together by hand-rolling with an aluminum roller at 120°. The laminated film was exposed for 128 seconds under vacuum as described for the plate of Example 7. The exposed film was heated at 100° for 10 minutes and then peeled apart to give both negative and positive-working peel apart images.

EXAMPLE 22

This example demonstrates dye absorption imaging.

A mixture of 0.50 part of poly(2-vinylpyridine), 3.00 part of Epocryl ® DRH-303, 0.23 part of 2-(o-chlorophenyl)-4,5-diphenylimidazolyl dimer, 0.20 part of 2-(o-chlorophenyl)-4,5-di(m-methoxyphenyl)imidazolyl dimer, 0.29 part of Michler's ketone, 0.05 part of 2-mercaptobenzthiazole, 0.50 part of polymethyl methacrylate resin binder, and 0.09 part of triethylene glycol dicaprylate was dissolved in 21.18 part of P-solvent (Example 21). To this solution were added 1.40 parts of itaconic acid and 0.80 part of the polyacid of Example 12 as a binder, and the solution was coated using a 2-mil doctor knife onto an oriented polyester film having a subcoating of gelatin which had been hardened. The coating was air-dried and then exposed for 4 seconds under vacuum as described for the plates of Example 7. The exposed film was allowed to stand for 60 seconds in contact with a saturated solution of Crystal Violet in 2-propanol. The excess dye was removed with excess 2-propanol, and a dark blue image remained in the exposed areas.

EXAMPLE 23

A mixture of 0.25 part of poly(2-vinylpyridine), 1.10 part of Epocryl ® DRH-303, 0.20 part of 2-(o-chlorophenyl)-4,5-diphenylimidazolyl dimer, 0.15 part of 2-(o-chlorophenyl)-4,5-di(m-methoxyphenyl)imidazolyl dimer, 0.23 part of Michler's ketone, 0.05 part of 2-mercaptobenzthiazole, 0.05 part of triethylene glycol dicaprylate, 0.11 part of a mixture of dispersants, 0.80 part of cinnamic acid, 0.50 part of titanium dioxide pigment, 0.05 part of stearic acid, and 14.10 parts of P-solvent (Example 21) was stirred for 5 minutes and 0.80 part of the polyacid of Example 12 as a binder was added. The mixture was milled in a sand grinder to disperse the pigment and the sand was separated by filtration through coarse filter paper. The resulting dispersion was coated using a 1-mil doctor knife onto an oriented polyester film substrate having a subcoating of gelatin which had been hardened, and the coating was air-dried. The dried film was exposed through the substrate for 1 second under vacuum as described for the plates of Example 7 through a 21-step $\sqrt{2}$ stepwedge and a dot pattern process transparency. The exposed plates were spray-developed with a 4/1 2-butoxyethanol/water solvent mixture followed by a 5-second water rinse. A last partial polymer step of 6 was observed. The average imaging energy over exposure times of 1 to 64 seconds was estimated to be 0.25 mj/cm$^2$, and the best dot reproduction was obtained at 1-second exposure. Positive-appearing prints were obtained by laminating the white imaged film to a black background.

EXAMPLE 24

A mixture of 3.00 parts of Epocryl ® DHR-303, 0.50 part of poly(2-vinylpyridine), 1.50 parts of itaconic acid and 0.40 part of 2-ethylanthraquinone was dissolved in 16.20 parts of P-solvent (Example 21). The solution was spin-coated onto anodized aluminum substrates (2000 rpm; 0.75 min), and the coated plates were exposed under vacuum as described in Example 7. The exposed plates were developed for 30 seconds in a 4/1 2-butoxyethanol/water solvent mixture followed by a 5-second rinse in 2-propanol. The results are summarized in Table XXI.

TABLE XXI

| Exposure Time (sec) | Number of Polymer Steps |
|---|---|
| 4 | 2 |
| 16 | 4 |
| 64 | 8 |

EXAMPLE 25

Three solutions were prepared from the materials shown in Table XXII.

TABLE XXII

|  | Solution, parts | | |
|---|---|---|---|
|  | Example 25 | Control A | Control B |
| Epocryl ® DRH-303 | 3.00 | 3.00 | — |
| Poly(2-vinyl-pyridine) | 0.50 | — | 1.00 |
| Itaconic acid | 1.50 | — | 3.00 |
| Benzoin isobutyl ether | 0.40 | 0.36 | 0.32 |
| Polyacid binder (Example 12) | — | 1.50 | — |
| P-solvent (Example 21) | 16.20 | 14.58 | 12.96[(1)] |

[(1)]Since Control B was not completely soluble in P-solvent, a mixture of 2.00 parts of 1,1,1-trichloroethane, 6 parts of methanol and 4.96 parts of 2-butoxyethanol was used in place of P-solvent.

The solutions were coated using a 1-mil doctor knife onto anodized aluminum substrates, dried at 25°, and the coated plates were exposed under vacuum as described in Example 7. The plate for Example 25 was developed for 30 seconds in a 4/1 2-butoxyethanol/water solvent mixture followed by a 5-second water rinse, and the plates for Controls A and B were developed for 30 seconds in a solution of 0.8 part of sodium carbonate, 90 parts of distilled water and 10 parts of 2-(2-butoxyethoxy)ethanol, followed by a 5-second water rinse. The results are summarized and compared with the results of Example 24 in Table XXIII. The compositions of Examples 24 and 25 show a 5.6-8 fold increase in speed compared with Controls A and B.

TABLE XXIII

| Plate | Exposure Time, (sec) | Number of Polymer Steps |
|---|---|---|
| Example 24 | 4 | 2 |
|  | 16 | 4 |
|  | 64 | 8 |
| Example 25 | 4 | 1 |
|  | 16 | 7 |
|  | 64 | 9 |
| Control A | 4 | — |
|  | 16 | — |
|  | 64 | 3 |
| Control B | 4 | — |
|  | 16 | — |
|  | 64 | 4 |

EXAMPLE 26

A mixture of 1.80 parts of 1:1 styrene/maleic anhydride copolymer partially esterified with 2-propanol (acid number 270, softening point 160°-170°, and number-average molecular weight 1700 by vapor pressure osmometry), 1.80 parts of a methyl methacrylate/ethyl acrylate/acrylic acid terpolymer (37:57:7), 3.50 parts of Epocryl® DRH-303, 0.40 part of 2-(o-chlorophenyl)-4,5-diphenylimidazolyl dimer, 0.40 part of 2-(o-chlorophenyl-4,5-di(m-methoxyphenyl)imidazolyl dimer, 0.53 part of Michler's ketone, 0.11 part of 2-mercaptobenzthiazole, 0.16 part of stearic acid, 0.12 part of a dispersant and 1.18 parts of 4-vinylpyridine was dissolved in 30 parts of P-solvent (Example 21). The solution was coated using a 1-mil doctor knife onto an oriented polyester film having a subcoating of gelatin which had been hardened, and the coating was air-dried. The dried coating (A) was exposed for 64 seconds under vacuum as described for the plates of Example 7, and the exposed film was developed in a 1% aqueous sodium carbonate solution to give a sharp image.

A second coating (B) was prepared using a 25-mil doctor knife, and the coating was dried at 100° for 5 minutes to give a dried coating 1.8 mils in thickness. For comparative purposes, using an average polymer density of about 1.18 g/cm$^3$, a layer thickness of 1.8 mils corresponds to a coating weight of about 540 mg/dm$^2$. The dried film was exposed through the substrate for 64 seconds under vacuum as described for the plates of Example 7, and the exposed film was developed in a 1% aqueous sodium carbonate solution followed by a rinse with 2-propanol. The raised image, 1.5 mils in depth, was inked and used as a relief (letterpress) printing plate to give good prints.

EXAMPLE 27

This example demonstrates a two-layer litho film.

Mixtures A and B were prepared from materials shown in Table XXIV.

TABLE XXIV

|  | Mixture (parts) | |
|---|---|---|
|  | A | B |
| Epocryl® DRH-303 | 2.00 | 2.20 |
| 2-(o-chlorophenyl)-4,5-diphenyl-imidazolyl dimer | 0.20 | 0.44 |
| 2-(o-chlorophenyl)-4,5-di-(m-methoxyphenyl)imidazolyl dimer | 0.19 | 0.40 |
| Michler's ketone | 0.26 | 0.56 |
| 2-mercaptobenzthiazole | 0.05 | 0.10 |
| Poly(2-vinylpyridine) | 0.50 | 0.50 |
| Itaconic acid | 1.50 | 1.50 |
| Polyacid binder (Example 12) | 1.80 | 1.60 |
| Carbon black | — | 2.00 |
| Stearic acid | — | 0.10 |
| Dispersant mixture | — | 0.21 |
| P-solvent (Example 21) | 19.50 | 28.23 |

Mixture A (clear solution) was filtered through coarse filter paper, and mixture B (pigmented) was milled in a sand grinder to disperse the pigment and the mixture was filtered through coarse filter paper. Mixture (B) was coated using a 1-mil doctor knife onto an oriented polyester film having a sub-coating of gelatin which had been hardened, and the coating was air-dried for 15 minutes. The film was overcoated using a 1-mil doctor knife with mixture A and the resulting film was air-dried for 15 minutes followed by drying for 5 minutes at 100° in a circulating air oven. The dried film was exposed for 16 seconds under vacuum as described in the plates of Example 7, and the exposed film was developed in a solution of 2/1 2-propanol/water which contained 0.01% of a surfactant. The last discernible polymer step was step 5, and a good contact litho film image was obtained.

EXAMPLE 28

Mixtures were prepared identical to mixture B of Example 27 except that the carbon black pigment was replaced with 2.00 parts of the following pigments.

| Mixture | Pigment |
|---|---|
| A | Diarylide Yellow Light Fast AAOT |
| B | Light Toluidine Red |
| C | Monastral® Blue GF |

The mixtures were milled in a sand grinder for 45 minutes at 1400 lfpm disc speed, and the dispersions were filtered through coarse filter paper. Each dispersion was coated using a 2-mil doctor knife onto an oriented polyester film having a subcoating of gelatin which had been hardened and the films were air-dried for 15 minutes followed by drying for 5 minutes at 100° in a circulating air oven. The dried films were exposed in each case for 1, 4, 16, and 64 seconds under vacuum as described for the plates of Example 7, and the exposed films were developed in a 2/1 2-propanol/water solvent mixture followed by rinsing in water. Sharp images of each color were obtained. Proper film combinations of the various colors could be superimposed to prepare full color images.

EXAMPLE 29

This example demonstrates the use of a composition of the invention to prepare a continuous tone print. A mixture of 0.50 part of poly(2-vinyl- pyridine), 3.00 parts of Epocryl® DRH-303, 0.44 parts of 2-(o-chlorophenyl)-4,5-diphenylimidazolyl dimer, 0.40 part of 2-(o- chlorophenyl)-4,5-di(m-methoxyphenyl)imidazolyl dimer, 0.56 part of Michler's ketone, 0.10 part of 2-mercaptobenzthiazole, 0.50 part of a polymethyl methacrylate resin binder, 0.09 part of triethylene glycol dicaprylate, and 0.11 part of a mixture of dispersants was dissolved in 28.12 parts of P-solvent (Example 21). To this solution were added 1.40 parts of itaconic acid and 0.80 part of a polyacid binder (Example 12) followed by 2.00 parts of carbon black and 2.00 parts of a 10% solution of a dispersant in toluene. The dispersion was filtered through a coarse fritted glass filter to remove large insoluble particles. The resulting dispersion was coated (2-mil doctor knife) onto an oriented polyester film substrate having a subcoating of gelatin which had been hardened, and the coating was air-dried. Samples of the dried film were exposed through the substrate for 3, 5, and 8 seconds in air to a 1000-watt tungsten-halogen lamp at a distance of 70 cm. A continuous tone silver halide film process transparency was employed. The exposed films were spray-developed until clear in the unexposed areas with a 4/1 2-butoxyethanol/water solvent mixture followed by a rinse in 2-propanol. Further spray-development had no apparent effect on density, and thus the films showed a wide development latitude after initial removal of unexposed material. The dry developed films were laminated to an adhesive white backing to give excellent continuous tone black and white prints. Visual examination showed that a 5-second exposure gave the print with the most detail.

EXAMPLE 30

A mixture of 0.17 part of a 1:1 styrene/maleic anhydride copolymer (Example 26), 0.33 part of the polyacid of Example 12, as a binder, 1.00 part of 2-vinylpyridine, 2.50 parts of Epocryl® DRH-303, 0.37 part of 2-(o-chlorophenyl)-4,5-diphenylimidazolyl dimer and 0.25 part of Michler's ketone was dissolved in 18.48 parts of solvent prepared by mixing 50 parts by volume of ethanol and 50 parts by volume of 1,1,1-trichloroethane. The solution was spin-coated onto anodized aluminum substrates (2000 rpm; 0.75 min), and the coated plates were exposed in air as described in Example 7. The exposed plates were developed for 15 seconds in a solution of 0.8 part of sodium carbonate, 90 parts of distilled water, and 10 parts of 2-(2-butoxyethoxy)ethanol, followed by a 5-second water rinse. The results are summarized in Table XXV.

TABLE XXV

| Exposure Time, (sec) | Number of Polymer Steps |
|---|---|
| 1 | 1 |
| 4 | 4 |
| 16 | 6 |
| 64 | 10 |

The plate exposed for 64 seconds was wet with fountain solution followed by inking with lithographic ink. A good print was obtained by rolling paper against the inked plate.

EXAMPLE 31

This example demonstrates the use of a composition of the invention in a two-exposure positive imaging process.

A mixture of 3.50 parts of Epocryl® RH-303, 1.80 parts of a 1:1 styrene/maleic anhydride copolymer (Example 26), 1.80 parts of a methyl methacrylate/ethyl acrylate/acrylic acid terpolymer (Example 16), 1.18 parts of 4-vinylpyridine, 0.28 part of 6-nitroveratraldehyde, and 0.82 part of 2-(o-chlorophenyl)-4,5-diphenylimidazolyl dimer was dissolved in 28.35 parts of P-solvent (Example 21). To this solution was added 0.07 part of 2,5-bis(4'-diethylamino-2'-methylbenzylidene)cyclopentanone in the absence of blue-green light. The resulting solution was spin-coated onto 2×2 inch (5.1×5.1 cm) anodized aluminum substrates (2000 rpm; 0.75 min), and a plate was exposed for 45 seconds under vacuum imagewise using a high contrast process transparency and a filter that allowed transmission of ultraviolet light while not transmitting blue-green light. The process transparency and filter were removed and the plate was given a second overall exposure for 64 seconds under vacuum using a filter that allowed transmission of blue-green light while not transmitting ultraviolet light. The exposures were carried out with a 1000-watt tungsten-halogen lamp at a distance of 70 cm. The exposed plate was spray-developed with a 4/1 2-butoxyethanol/water solvent mixture, and a good positive image was obtained, i.e., polymerization occurred in the areas not struck by radiation during the first exposure.

EXAMPLE 32

This example demonstrates the use of a polymer which contains both acidic and basic salt-forming groups.

A 2-vinylpyridine/methacrylic acid copolymer was prepared as follows. A mixture of 21.03 parts of 2-vinylpyridine, 25.83 parts of methacrylic acid and 0.05 part of azobisisobutyronitrile was stirred and heated at 70° under dry nitrogen for 2 hr. An additional 0.05 part of azobisisobutyronitrile was added. After about 14 min at 70° an exothermic reaction raised the temperature 140°. The heating bath was removed and the solid reaction product was dissolved in 100 ml of warm dimethylformamide. The polymer was precipitated by pouring the dimethylformamide solution into a blender containing 200 ml of methyl ethyl ketone. After washing with 100 ml of methyl ethyl ketone and drying 16 hr at 40° under about 0.2 MM$_{Hg}$ there was obtained 27.66 parts of white solid copolymer. The polymer was soluble in dimethylformamide and in aqueous acidic and basic solutions, but it was insoluble in water and most organic solvents. Differential scanning calorimetry showed endothermic events at 115°, 139° and 204°. The polymer melt temperature on a copper block was about 200°–205°.

A mixture of 2.00 parts of Epocryl® DRH-303, 0.65 part of 2-vinylpyridine/methacrylic acid copolymer prepared above, 0.20 part of 2-(o-chlorophenyl)-4,5-diphenylimidazolyl dimer, 0.19 part of 2-(o-chlorophenyl)-4,5-di(m-methoxyphenyl)imidazolyl dimer, 0.26 part of Michler's ketone, 0.55 part of 2-mercaptobenzthiazole, 1.30 parts of itaconic acid and 0.0002 part of a dispersant was dissolved in 13.65 parts of dimethylformamide. The filtered solution was coated using a 2-mil doctor knife onto an oriented polyester film having a subcoating of a vinylidene chloride copolymer, and the coating was air-dried. The dried film was exposed through the substrate for 1 second in air and under vacuum as described for the plates of Example 7 through a 21-step √2 stepwedge and a dot pattern process transparency. The exposed plates were spray-developed with a 1/1 2-propanol/water solution. A last partial polymer step of 9 was observed for both vacuum and air exposures, equivalent to about 0.09 millijoule/cm² minimum imaging energy.

INDUSTRIAL APPLICABILITY

The photopolymerizable compositions and elements of this invention are particularly suitable for use as lithographic plates, lithographic films, letterpress plates, and as photoresist coatings on copper substrates. These compositions and elements are also useful for various pattern or image yielding purposes in both negative and positive-working systems. Such systems include peel apart imaging, dye absorption imaging, two-layer lithographic film, pigmented color imaging, and continuous tone printing. They are especially useful in making printing reliefs by the general procedures described in U.S. Pat. Nos. 2,760,863 and 3,060,026. An advantage of these compositions is that they have enhanced speed and they are relatively insensitive to oxygen. If desired, they may be used without the usual cover sheet. Other specific uses are described in the above cited patents and U.S. Pat. No. 3,060,023.

I claim:

1. A photopolymerizable element which comprises a substrate coated with a layer of a photopolymerizable composition comprising 0 to 70% by weight of components which do not contribute to the photoactivity of the composition and 30 to 100% by weight of photoactive system components consisting essentially of
   (1) polymer having a number average molecular weight of at least 500, at least two-salt forming groups selected from the group consisting of carboxylic acid groups and amine groups per polymer molecule, and at least 0.025 equivalent of salt-forming group per 1000 grams of polymer;
   (2) addition-polymerizable, nongaseous, ethylenically unsaturated compound having at least one complementary salt-forming group selected from the group consisting of carboxylic acid groups and amine groups and being capable of forming a polymer by free-radical initiated, chain-propagating addition polymerization; the ratio of equivalents of complementary salt-forming groups in compound (2) to equivalents of salt-forming groups in polymer (1) being 1:2 to 50:1;
   (3) ethylenically unsaturated diester polyhydroxy polyether of the formula

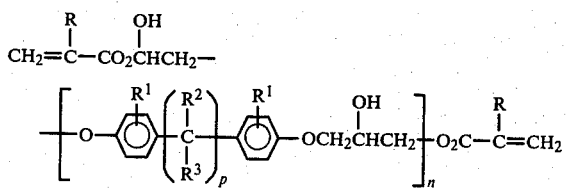

wherein R is H or CH₃; R¹ is H or an alkyl group of 1-4 carbon atoms; n is 1-15; p is 0 or 1; and when p is 1, R² is H or CH₃ and R³ is H, CH₃ or C₂H₅; the amount of polyether (3) being 10 to 75% by weight of the combined total of components (1), (2) and (3); and
   (4) 1 to 20% by weight, based on the total photopolymerizable composition, of a free-radical generating system, activatable by actinic radiation, which initiates polymerization of the unsaturated compounds;
said layer having a thickness in the range from a coating weight of 1 mg/dm² to 5 mils in thickness.

2. The photopolymerizable element of claim 1 in which polymer (1) has salt-forming groups selected from the group consisting of carboxylic acid groups and amine groups, and unsaturated compound (2) has complementary salt-forming groups selected from the group consisting of carboxylic acid groups and amine groups.

3. The photopolymerizable element of claim 2 in which R¹ is H, p is 1, and R² and R³ are CH₃.

4. The photopolymerizable element of claim 3 in which polymer (1) has a molecular weight of at least 600, and contains at least 1.0 equivalent of salt-forming group per 1000 grams of polymer, unsaturated compound (2) is present in an amount sufficient to provide 1 to 15 equivalents of complementary salt-forming group for each equivalent of salt-forming group in polymer (1), polyether (3) is 15 to 75% by weight of the combined total of components (1), (2) and (3), and free-radical generating system (4) is a 2,4,5-triarylimidazolyl dimer and a free-radical producing electron donor, and is present in the amount of 5–18% by weight, based on the total photopolymerizable composition.

5. The photopolymerizable element of claim 4 in which the photopolymerizable composition also contains 5 to 70% by weight of polymeric binder.

6. The photopolymerizable element of claim 5 in the form of presensitized lithographic plate.

7. The photopolymerizable element of claim 5 in the form of a presensitized printing plate.

8. The photopolymerizable element of claim 5 in the form of a presensitized lithographic film.

9. The photopolymerizable element of claim 8 in the form of a two-layer presensitized lithographic film.

10. The photopolymerizable element of claim 5 in the form of a photoresist coating on a copper substrate.

11. A method of photoimaging which comprises imagewise exposing a photopolymerizable composition to actinic radiation containing wavelengths of 2000–8000 Å through an image-bearing transparency and developing the image, said photopolymerizable composition comprising 0 to 70% by weight of components which do not contribute to the photoactivity of the composition and 30 to 100% by weight of photoactive system components consisting essentially of
   (1) polymer having a number average molecular weight of at least 500, at least two salt-forming groups selected from the group consisting of carboxylic acid groups and amine groups per polymer molecule, and at least 0.025 equivalent of salt-forming group per 1000 grams of polymer;
   (2) addition-polymerizable, nongaseous, ethylenically unsaturated compound having at least one complementary salt-forming group selected from the group consisting of carboxylic acid groups and amine groups and being capable of forming a polymer by free-radical initiated, chain-propagating addition polymerization; the ratio of equivalents of complementary salt-forming groups in compound (2) to equivalents of salt-forming groups in polymer (1) being 1:2 to 50:1;
   (3) ethylenically unsaturated diester polyhydroxy polyether of the formula

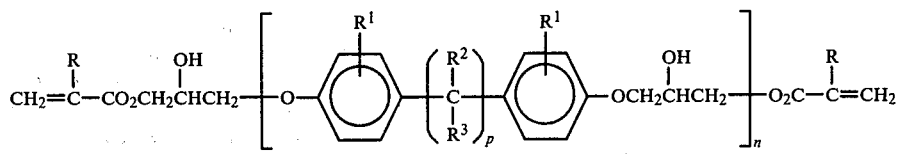

wherein R is H or $CH_3$; $R^1$ is H or an alkyl group of 1–4 carbon atoms; n is 1–15; p is 0 or 1; and when p is 1, $R^2$ is H or $CH_3$ and $R^3$ is H, $CH_3$ or $C_2H_5$; the amount of polyether (3) being 10 to 75% by weight of the combined total of components (1), (2) and (3); and (4) 1 to 20% by weight, based on the total photopolymerizable composition, of a free-radical generating system, activatable by actinic radiation, which initiates polymerization of the unsaturated compounds.

12. The method of claim 11 in which the image is developed by solvent water.

13. The method of claim 11 in which the image is developed by toning.

\* \* \* \* \*

UNITED STATES PATENT AND TRADEMARK OFFICE
CERTIFICATE OF CORRECTION

PATENT NO. : 4,291,115
DATED : September 22, 1981
INVENTOR(S) : William John Chambers It is certified that error appears in the above—identified patent and that said Letters Patent is hereby corrected as shown below:

In the abstract and in column 29, line 52, at each occurrence the portion of the structural formula reading " $CH_2=\overset{R}{\underset{|}{C}}-CO_2\overset{OH}{\underset{|}{C}}HCH_2-$ " should read -- $CH_2=\overset{R}{\underset{|}{C}}-CO_2CH_2\overset{OH}{\underset{|}{C}}HCH_2-$ --.

Column 4, line 30, "preferred" should read -- preformed -- and in line 50 "ββ" should read -- β,β --. Column 5, line 41, "ester" should read -- esters --. Column 9, line 62, "polymerizable" should read -- photopolymerizable --. Column 11, line 15, "improved" should read -- improve --. Column 13, line 14, "MIlls" should read -- Mills --. Column 17, line 59, "Versamide" should read -- Versamid --. Column 19, line 52, in Table XIV, the column entitled "Air", "-6" should read -- - --. Column 20, line 29, "125" should read -- 125) --. Column 27, line 65, "RH-303" should read -- DRH-303 --. Column 29, line 13, "im ging" should read -- imaging -- and in line 32 "two-salt forming" should read -- two salt-forming--. Column 30, line 31, -- a -- should appear after "of".

Signed and Sealed this

First Day of June 1982

[SEAL]

Attest:

GERALD J. MOSSINGHOFF

Attesting Officer

Commissioner of Patents and Trademarks